United States Patent [19]

Murakami

[11] Patent Number: 5,761,209
[45] Date of Patent: Jun. 2, 1998

[54] METHOD OF TRANSMITTING DIGITAL SIGNALS, TRANSMITTER AND RECEIVER USED THEREFOR

[75] Inventor: Mahito Murakami, Tokyo, Japan

[73] Assignee: NEC Corporation, Tokyo, Japan

[21] Appl. No.: 616,302

[22] Filed: Mar. 15, 1996

[51] Int. Cl.$^6$ .................................................. H04J 3/04
[52] U.S. Cl. ........................................ 370/536; 375/377
[58] Field of Search .................................. 370/458, 498, 370/503, 505, 506, 511, 515, 535, 536, 537, 538, 504; 348/384, 390–393, 396; 382/232; 375/363, 377

[56] References Cited

U.S. PATENT DOCUMENTS

| | | | |
|---|---|---|---|
| 4,644,536 | 2/1987 | Utsumi | 370/509 |
| 4,953,163 | 8/1990 | Miyamoto et al. | 370/516 |
| 5,280,537 | 1/1994 | Sugiyama et al. | 375/200 |

*Primary Examiner*—Hassan Kizou
*Assistant Examiner*—A. Bnimoussa
*Attorney, Agent, or Firm*—Helfgott & Karas, P.C.

[57] ABSTRACT

A method of transmitting digital signals which allows transmission of signals at a different transmission speed from that of composite serial digital signals, without any changes in the internal configurations of transmitting systems based on time division multiplexing, and a transmitter and a receiver used therefor. Dummy data is added to component serial digital signals inputted through an input terminal 10, with a decoder 21, a dummy data add circuit 22 and a 35/33 multiply circuit 23, to convert them into redundant component parallel digital signals of a sampling frequency twice the frequency of the composite parallel digital signals. The signals are converted into two series of pseudo composite serial digital signals with an encoder 24, a ten-fold multiply circuit 25 and a switching circuit 26, and then sent to a time division multiplexer for a plurality of composite serial digital signals.

7 Claims, 3 Drawing Sheets

$31_1 \sim 31_N$: COMPOSITE SERIAL DIGITAL SIGNAL INPUT $51_1 \sim 51_N$: COMPOSITE SERIAL DIGITAL SIGNAL OUTPUT

METHOD OF TRANSMITTING DIGITAL SIGNALS, TRANSMITTER AND RECEIVER USED THEREFOR

BACKGROUND OF THE INVENTION

1. Field of the Invention

The present invention relates to a method of transmitting digital signals, and a transmitter and a receiver used therefor, and more particularly to a method of transmitting component digital signals along a transmission path for serial transmission, by time division multiplexing, of a plurality of composite digital signals which have been obtained by separately encoding a plurality of composite video signals, and to a transmitter and a receiver used therefor.

2. Description of the Prior Art

FIG. 2 is a schematic diagram illustrative of an example of a conventional method of transmitting digital signals. As illustrated in the drawing, according to this prior art, a time division multiplexer 30 is designed to be connected to a time division demultiplexer 50 via a cable 40. Composite serial digital signals are inputted through N respective input terminals $31_1$–$31_N$ of the time division multiplexer 30. The time division demultiplexer 50 outputs the time division multiple digital signals inputted via the cable 40 to N output terminals $51_1$–$51_N$ bit-by-bit in a cyclic manner.

The operation according to this method of transmitting digital signals of the prior art will now be explained with reference to the time chart of FIG. 3. For brevity, the explanation will be made on the assumption that the number N of multiplexing/demultiplexing channels of the time division multiplexer 30 and the time division demultiplexer 50 is "4". Four-channel composite serial digital signals are inputted through respective input terminals $51_1$–$51_4$. These composite serial digital signals are digital signals generated by bit-by-bit serial transmission at a transmission speed of 143 Mbps, for example, of composite parallel digital signals obtained by sampling analog composite video signals (composite signals), which are multiple signals composed of luminance signals and carrier chrominance signals multiplexed to share a band with the high-frequency region of the luminance signals at a prescribed frequency and then digitizing the sampled signals through quantization in a prescribed number of bits.

All the four-channel composite serial digital signals to be inputted to the time division multiplexer 30 are required to be synchronized in their frequencies. The time division multiplexer 30 samples, bit-by-bit, the four-channel composite serial digital signals CH1, CH2, CH3 and CH4 illustrated in FIGS. 3(B), 3(C), 3(D) and 3(E) which are inputted to the respective input terminals $51_1$–$51_4$ in order of the channels in accordance with system clocks (CLKs) illustrated in FIG. 3(A) at a frequency four times the sampling frequency of the composite serial digital signals to be inputted, and synthesizes the sampled signals in a time series to produce time division multiple signals as illustrated in FIG. 3(F) which are then outputted through the cable 40 at a transmission speed synchronized with the system clocks.

The time division multiple signals transmitted via the cable 40 are supplied to the time division demultiplexer 50 where the system clocks are first extracted by the internal timing extract circuit, the signals multiplexed with the clocks are separated in bits, and the separated one-bit data are successively outputted through the output terminals $51_1$, $51_2$, $51_3$, $51_4$, $51_1$, . . . , for example, in a cyclic manner. In this way, the composite serial digital signals in channels 1–4 are restored and outputted through the output terminals $51_1$–$51_4$.

According to the above conventional method of transmitting digital signals, however, since all the signals to be inputted to the respective channels are required to be synchronized in their frequencies, it is impossible to simultaneously transmit both composite serial digital signals and signals transmitted at different speeds from the former (e. g., component serial digital signals). In addition, the timing extract circuit used inside the time division demultiplexer 50, being specific to the transmission speed, must be replaced when the transmission speed of the signals to be transmitted is changed. Furthermore, in cases where the multiple signal output speed of the time division multiplexer 30 has a maximum, increase in the transmission speed of the signals to be inputted requires not only simple replacement of the timing extract circuit, but also troublesome changing of the multiplicity, thus resulting in numerous changes in the circuit.

SUMMARY OF THE INVENTION

An object of the present invention, which has been accomplished in view of these circumstances, is to provide a method wherein a digital signal transmission system for transmitting multi-channel composite serial digital signals along a single transmission path through time division multiplexing is used for transmitting digital signals at a different transmission speed from that of the composite serial digital signals, without any changes in the internal configuration of the system, and a transmitter and a receiver used for the method.

An additional object of the present invention is to provide a method of transmitting digital signals which allows transmission of a mixture of composite serial digital signals and signals at a different transmission speed from that of the former, and a transmitter and a receiver used therefor.

In order to accomplish the objects mentioned above, the present invention is designed so that first serial digital signals at a first transmission speed are converted into first parallel digital signals of a first sampling frequency, and then dummy data is added to the first parallel digital signals to produce redundant parallel digital signals of a second sampling frequency by using second clocks which are produced by conversion of the frequency of first clocks in the first parallel digital signals into a prescribed frequency; the redundant parallel digital signals are converted into serial signals which are then divided in bits alternately between two output terminals based on switching signals of a prescribed frequency obtained by multiplying the frequency of the second clocks, to output pseudo, second serial digital signals at a second transmission speed via the two output terminals, respectively; at least two of the pseudo, second serial digital signals are transmitted through a time division multiplexer where the two are processed as two-channel serial digital signals by time division multiplexing, via a transmission path to a time division demultiplexer through which the two pseudo, second serial digital signals are taken in parallel; third clocks which are extracted from the two pseudo, second serial digital signals taken in parallel from the time division demultiplexer, are multiplexed to a prescribed frequency to generate fourth clocks which are used to convert the two pseudo, second serial digital signals into a single series of serial digital signals which are then converted into redundant parallel digital signals; the dummy data is deleted from the redundant parallel digital signals based on signals generated by dividing the frequency of the fourth clocks into prescribed frequencies to restore the first parallel digital signals; and the first parallel digital signals are encoded to restore the first serial digital signals.

Also, the time division multiplexer according to the present invention has a plurality of at least three, channels with input terminals for the second serial digital signals at the second transmission speed, and two of the pseudo, second serial digital signals are inputted through the input terminals for two of the channels to be processed together with the second serial digital signals by time division multiplexing into a single series of signals. In addition, the transmitter according to the present invention is constructed with a decoder for converting first serial digital signals at a first transmission speed into first parallel digital signals of a first sampling frequency; a first multiply circuit for converting first clocks in the first parallel digital signals which have been taken through the decoder, into second clocks of a prescribed frequency; a dummy data add circuit for adding dummy data to the first parallel digital signals based on the first and the second clocks to produce redundant parallel digital signals of a second sampling frequency; an encoder for converting the redundant parallel digital signals into serial signals; a second multiply circuit for multiplying the frequency of the second clocks to a prescribed frequency; and a switching circuit for receiving the clocks outputted through the second multiply circuit as switching signals, and dividing the serial signals from the encoder in bits alternately between two output terminals to output them as pseudo, second serial digital signals at a second transmission speed through the two output terminals, respectively.

On the other hand, the receiver according to the present invention is constructed with clock generating means for extracting the third clocks from the two pseudo, second serial digital signals which have been taken in parallel through the time division demultiplexer to multiply their frequency to a prescribed frequency to produce the fourth clocks; a switching circuit for receiving the fourth clocks as switching signals to synthesize the two pseudo, second serial digital signals from the time division demultiplexer, in bits alternately to output the redundant serial digital signals; a decoder for decoding the redundant serial digital signals for conversion into the redundant parallel digital signals mentioned above; a frequency demultiply circuit for demultiplying the fourth clocks to produce timing signals of a prescribed frequency; a dummy data delete circuit for deleting the dummy data from the redundant parallel digital signals based on the timing signals outputted from the frequency demultiply circuit, to restore the first parallel digital signals; and an encoder for encoding the first parallel digital signals taken through the dummy data delete circuit to restore the first serial digital signals. Since the present invention is designed so that the transmitter converts the first serial digital signals at the first transmission speed into the pseudo, second serial digital signals at the second transmission speed which are outputted through the two output terminals, the outputted signals are transmitted to the receiver as the two-channel, second serial digital signals via the time division multiplexer which processes the multi-channel, second serial digital signals at the second transmission speed by time division multiplexing, the transmission path and the time division demultiplexer, and are restored to the original first serial digital signals through the receiver, the first serial digital signals at the first transmission speed may be transmitted using the transmission path for transmitting the second serial digital signals at the second transmission speed.

Particularly, in cases where according to the present invention, the first serial digital signals are component serial digital signals obtained by serially synthesizing digital luminance signals and two types of digital chrominance signals in bits which have been obtained separately by sampling luminance signals and two types of chrominance signals at a prescribed frequency, and encoding them; the first parallel digital signals are component parallel digital signals produced by successively synthesizing the digital luminance signals and the two types of digital chrominance signals in parallel by quantization in a prescribed number of bits; the second parallel digital signals are composite parallel digital signals produced by sampling at a prescribed frequency and encoding of multiple signals composed of luminance signals and carrier chrominance signal multiplexed to share a band with the high-frequency region of the luminance signals; and the second serial digital signals are composite serial digital signals produced by bit-by-bit serial synthesis of the composite parallel digital signals, the component serial digital signals and the composite serial digital signals, which usually have greatly differing transmission speeds, have close sampling frequencies, and thus the integer-rounded ratio of the sample numbers is close to 1:1.

Accordingly, the present invention allows transmission of a single series of component serial digital signals utilizing the characteristics of the variety of digital signals mentioned above by dividing the component serial digital signals into two through the transmitter which are outputted as pseudo, second serial digital signals through the two output terminals, respectively, and using the two channels of the composite serial digital signal transmission system of the time division multiplexer.

BRIEF DESCRIPTION OF THE DRAWINGS

FIG. 3 is a timing chart for explaining the operation according to the example illustrated in FIG. 2

DETAILED DESCRIPTION OF THE PREFERRED EMBODIMENTS

The present invention will now be explained with reference to its embodiments.

Figure 1:
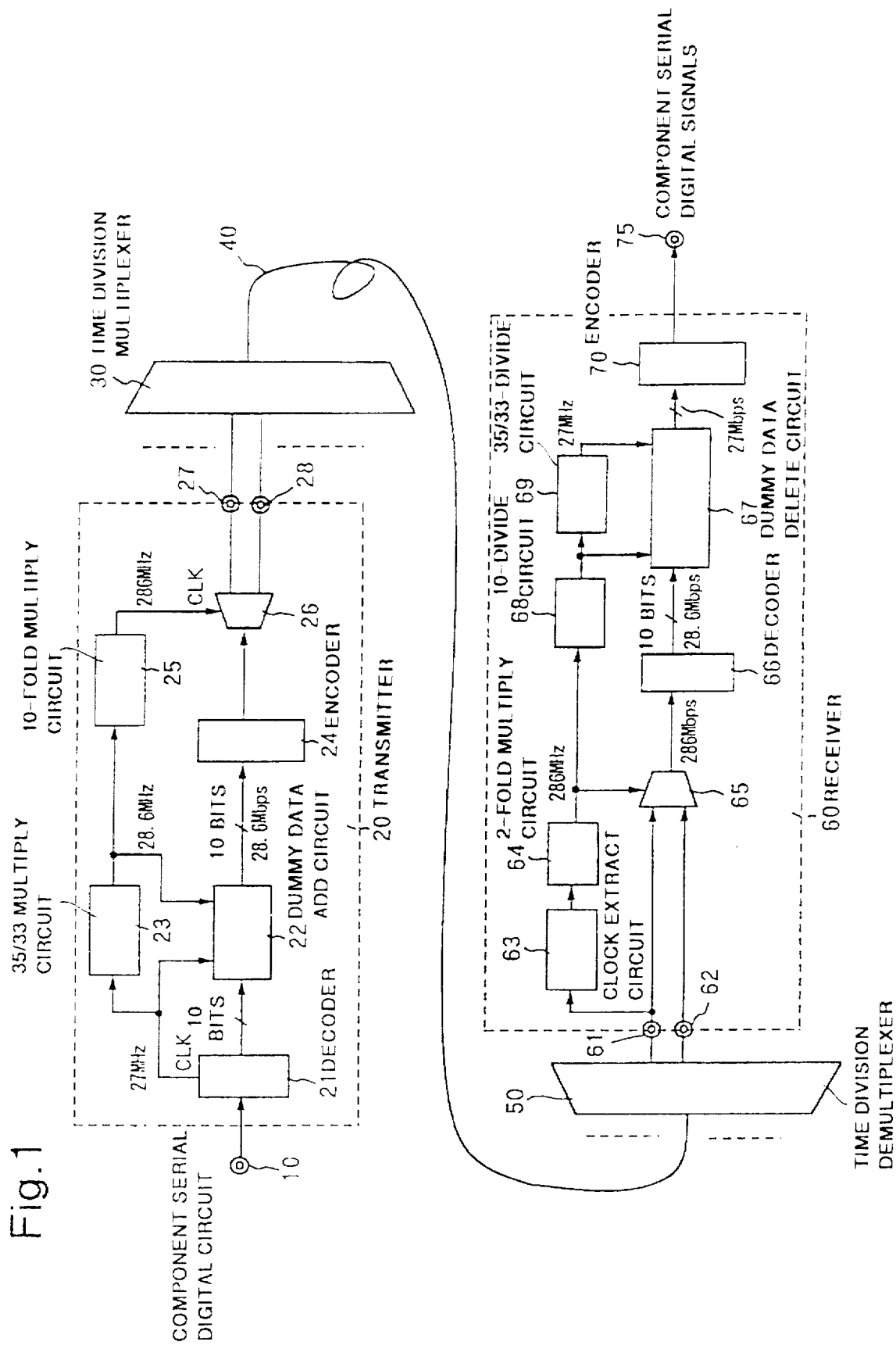
FIG. 1 is a view illustrative of the system configuration of an embodiment of the present invention.
Figure 2:
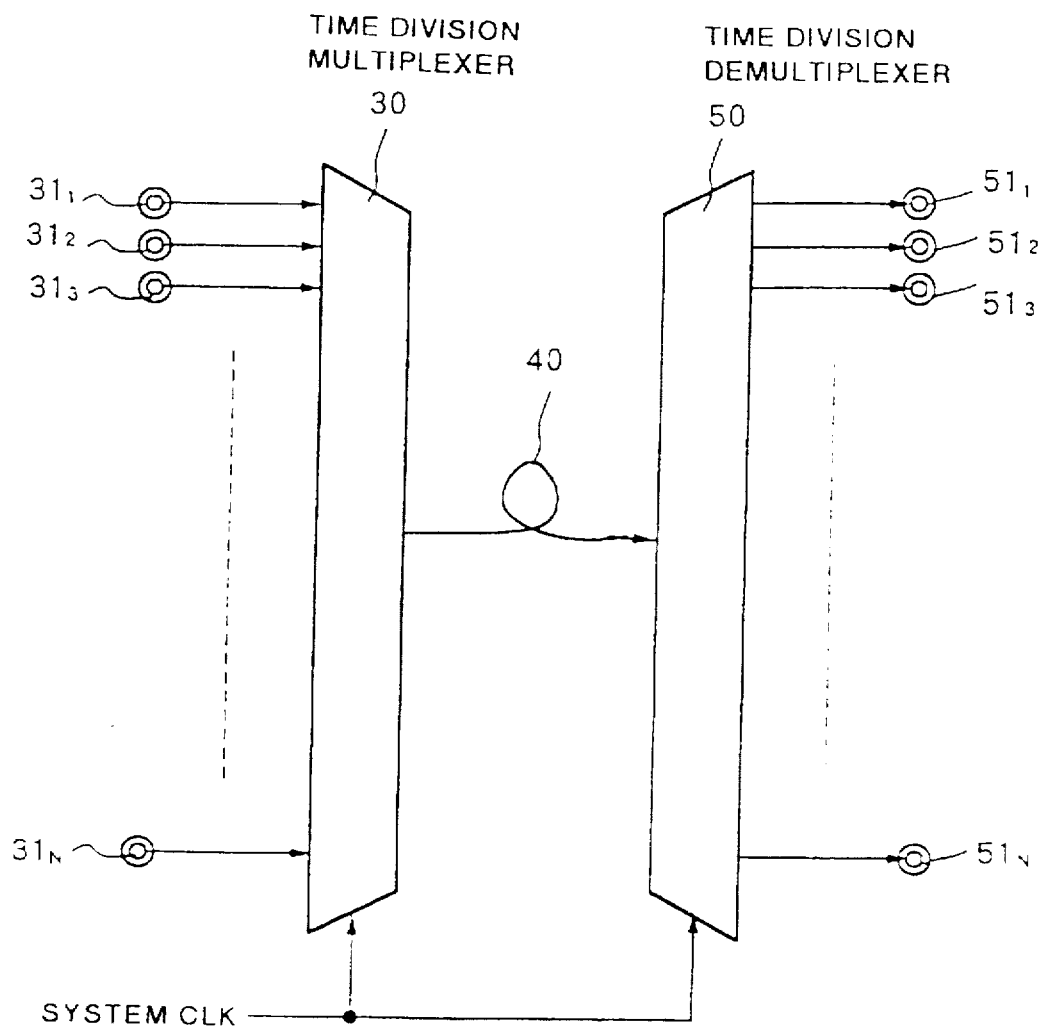
FIG. 2 is a schematic diagram illustrative of an example of the methods of the prior art.

FIG. 1 is a view illustrative of the system configuration of an embodiment of the present invention. In the drawing, a transmitter 20 converts a single series of component serial digital signals, which have been inputted through an inlet terminal 10, into two series of composite serial digital signals which are then outputted to a time division multiplexer 30 through output terminals 27, 28. The time division multiplexer 30, a cable 40 and a time division demultiplexer 50 are the same types as those used for configuration of the above-mentioned conventional time division transmission system for composite serial digital signals.

A receiver 60 returns the two series of composite serial digital signals inputted from a time division demultiplexer 50 via input terminals 61, 62 to the single series of component serial digital signals which are then outputted through the output terminal 75.

Here, the component serial digital signals mentioned above are serial signals at a transmission speed of 270 Mbps which are produced by synthesizing, successively in time sequence and in series, digital luminance signals obtained by sampling at a sampling frequency of 13.5 MHz, quantization in ten bits and encoding of luminance signals Y, and two types of digital color difference signals (chrominance signals) separately obtained by sampling at a sampling frequency of 6.75 MHz, and subsequent quantization in ten bits and encoding of two types of color difference signals CR and CB, in a cycle in order of, for example, a first digital color difference signal, a digital luminance signal, a second digital color difference signal and a digital luminance signal. In contrast, the component parallel digital signals are parallel signals comprising the above-mentioned digital luminance signals and two types of digital color difference signals transmitted in parallel.

On the other hand, the composite serial digital signals mentioned above are serial signals at a transmission speed of 143 Mbps which are produced by serially synthesizing composite parallel signals in bits which are obtained by sampling at a sampling frequency of 14.3 MHz, and subsequent quantization in ten bits and encoding of analog composite video signals (composite signals), that is, multiple signals composed of luminance signals and carrier chrominance signals multiplexed to share a band with the high-frequency region of the luminance signals.

A variety of dimensions of the respective digital signals mentioned above are summarized in the following Table 1:

TABLE 1

|  |  | Composite signals | Component signals |
|---|---|---|---|
| Serial | Transmission speed | 143 Mbps | 270 Mbps |
| Parallel | Sampling frequency | 14.3 MHz | Y:13.5 MHz CR, CB:6.75 MHz |
|  | Sample number per 1H | 910 | Y:858 CR, CB:429 |
|  | Integer-rounded ratio of sample numbers | 35 | Y:33 CR, CB:16.5 (CR + CB:33) |

A transmitter 20 is constructed with a decoder 21, a dummy data add circuit 22, a 35/33-fold multiply circuit 23, an encoder 24, a ten-fold multiply circuit 25 and a switching circuit 26. The decoder 21 decodes the inputted component serial digital signals to output component parallel digital signals. The output from the decoder 21 also contains clocks (CLKs) of a repetition frequency of 27 MHz which have been extracted from the component serial digital signals.

The dummy data add circuit 22 adds dummy data to the decoded component serial digital signals to produce parallel digital signals (hereunder referred to as "redundant component parallel digital signal") at a transmission speed of 28.6 MHz, twice the transmission speed of the composite parallel digital signals. The 35/33-fold multiply circuit 23 produces, from the inputted 27-MHz clocks, 28.6-MHz clocks synchronized with them.

The encoder 24 converts the redundant component parallel digital signals from the dummy data add circuit 22 into serial digital signals (hereunder referred to as "redundant component serial signals") at a transmission speed of 286 MHz, exactly twice the transmission speed of the composite serial digital signals. The ten-fold multiply circuit 25 multiplies the frequency of the 28.6-Mhz clocks by a factor of 10 to produce clocks of 286 MHz. The switching circuit 26 divides the serial digital signals from the encoder 24 in bits between the two output terminals 27, 28 to output pseudo composite serial digital signals.

The receiver 60 is constructed with a clock extract circuit 63, a two-fold multiply circuit 64, a switching circuit 65, a decoder 66, a dummy data delete circuit 67, a divide-by-ten circuit 68, a divide-by-35/33 circuit 69 and an encoder 70. The clock extract circuit 63 extracts clocks of 143 Mhz from the pseudo composite serial digital signals at a transmission speed of 143 MHz which have been inputted via the input terminal 61. The two-fold multiply circuit 64 doubles the frequency of the inputted clocks. The switching circuit 65 outputs the signals inputted via the input terminals 61, 62 in bits alternately based on the clocks outputted through the two-fold multiply circuit 64. The decoder 66 decodes the inputted composite serial digital signals. The dummy data delete circuit 67 deletes the dummy data in the inputted signals. The encoder 70 encodes the inputted digital signals to output the component serial digital signals through the output terminal 75.

With the digital signal transmission system described above, the component serial digital signals and the composite serial digital signals have greatly differing transmission speeds of 270 MHz and 143 MHz, as listed in Table 1. On the other hand, in the case of the component parallel digital signals, the sampling frequency of the digital luminance signals is 13.5 MHz, and a total of the sampling frequencies of the two types of digital color difference signals is 13.5 MHz, whereas the sampling frequency of the composite parallel digital signals is 14.3 MHz; thus they have close sampling frequencies of 13.5 MHz and 14.3 MHz, and the sample numbers are close to each other as well, as evidenced by their ratio 33:35 rounded to integers.

Therefore, making use of the characteristics of the variety of digital signals described above, the present invention is designed so that the transmitter 20 divides the component serial digital signals (at a transmission speed of 270 Mbps) into two (each at a transmission speed of 135 Mbps), and a single series of component serial digital signals is transmitted utilizing two channels of the transmission system for the composite digital signals. The operation according to the present embodiment will now be explained. The component serial digital signals inputted through the input terminal 10 are supplied to the decoder 21 to be converted into component parallel signals which are supplied to the dummy data add circuit 22 in parallel in ten bits, while the 27-MHz clocks extracted by the decoder 21 from the component serial digital signals themselves are supplied to the 35/33-fold multiply circuit 23 to multiply the frequency to 28.6 MHz by a factor of 35/33.

The dummy data add circuit 22 writes the component parallel digital signals outputted from the decoder 21 to an internal memory for one horizontal scanning period (1H) (hereunder referred to as "1H memory") based on the 27-MHz clocks, and writes dummy data to the 1H memory additionally upon completion of the writing. The dummy data is data of no significance which is added only to bring the integer-rounded ratio of the component signals and the composite signals close to 1:1.

The dummy data-added component parallel digital signals are then read out from the 1H memory in the dummy data add circuit 22, in synchronization with clocks from the 35/33-fold multiply circuit 23 as the read clocks. The length of time of the 1H is the same for both the signals inputted to and outputted from the 1H memory, and the dummy data-added redundant component parallel digital signals of a sampling frequency equalized to 28.6 MHz are taken in parallel in ten bits.

The encoder 24 receives these redundant component parallel digital signals as input signals, and the signals are converted into the redundant component serial signals in series in bits which are transmitted at a speed of 286 Mbps, and then supplied to the switching circuit 26. This switching circuit 26 outputs the two series of pseudo composite serial digital signals at a transmission speed of 143 Mbps in bits alternately through the output terminals 27, 28 based on the switching signals of 286 MHz which have been obtained by ten-fold multiplication of the frequency of the clocks outputted from the 35/33-fold multiply circuit 23, by the ten-fold multiply circuit 25.

Here, the term "pseudo composite serial digital signals" means signals at a transmission speed of 143 Mbps which is equivalent to that of the original composite serial digital signals, but in a different format from the composite serial digital signals, since they are signals carrying the dummy data in addition to the luminance signals or the two types of color difference signals (chrominance signals).

In addition, since parallel signals include frame patterns matching slits of the scanning lines on the screen which facilitate detection of timings for inserting/deleting the dummy data, the transmitter 20 processes the component serial digital signals after they have been converted into parallel signals. The foregoing explains the course of conversion of the transmission speed of serial digital signals through the transmitter 20. The receiver 60 processes the signals in the reverse order to their processing through the transmitter 20.

More specifically, the two series of pseudo composite serial digital signals at a transmission speed of 143 Mbps which have been taken through the output terminals 27, 28 are inputted through two of the N input terminals of the time division multiplexer 30 where the inputted pseudo composite serial digital signals are processed by time division multiplexing together with composite serial digital signals inputted through the other N-2 input terminals, and then supplied to the time division demultiplexer 50 via the cable 40 for time division demultiplexing, and the above-mentioned two series of pseudo composite serial digital signals at a transmission speed of 143 Mbps are taken through the output terminals 61, 62.

Either series of pseudo composite serial digital signals inputted through the input terminals 61 is supplied to the clock extract circuit 63 to extract clocks of 143 MHz, while being supplied to the switching circuit 65 together with the other series of pseudo composite serial digital signals inputted through the input terminal 62. The clocks extracted by the clock extract circuit 63 are supplied to the two-fold multiply circuit 64 to double the frequency to 286 MHz, and then supplied to the switching circuit 65 as switching signals while being supplied to the divide-by-ten circuit 68.

The switching circuit 65 samples the two series of pseudo composite serial digital signals in bits alternately for every cycle of the switching signals mentioned above, for synthesis in a time series for conversion into the redundant component serial digital signals at a transmission speed of 286 Mbps which are then supplied to the decoder 66 where the signals are sampled at a frequency of 28.6 MHz and quantized in ten-bits to be converted into redundant component parallel digital signals.

The dummy data delete circuit 67 writes the redundant component parallel digital signals outputted from the decoder 66 in an internal memory (1H' memory) for one horizontal scanning period (1H'), based on clocks of 28.6 MHz from the divide-by-ten circuit 68. Here, the added dummy data is not written during the period 1H', and is thus deleted. Then, the dummy data-deleted component parallel digital signals are read out from the 1H' memory in the dummy data delete circuit 67, synchronized with the 27-MHz clocks from the divide-by-35/33 circuit 69 as the read clocks.

The length of time of the 1H' is the same for both the signals inputted to and outputted from the 1H' memory, and component parallel digital signals, which have been sampled at a frequency of 27 MHz, are taken from the dummy data delete circuit 67 in parallel in ten bits. The encoder 70 synthesizes these component parallel digital signals in series in bits to restore the component serial digital signals at a transmission speed of 270 Mbps which are outputted through the output terminal 75.

As described above, according to the present embodiment, since the transmitter 20 and the receiver 60 for conversion of transmission speeds are set outside the time division multiplex transmission system for composite serial digital signals, composite serial digital signals may be transmitted in admixture with component serial digital signals without the necessity of changing circuits inside the time division multiplex transmission system comprising the time division multiplexer 30, the cable 40 and the time division demultiplexer 50.

Needless to mention, the present invention is not restricted to the embodiment described above; for example, the transmission path, being the cable 40 according to the embodiment, may of course be an optical fiber cable, wireless transmission path or the like, instead. In addition, although the explanation was made with reference to composite signals and component signals as the digital signals to be transmitted, the present invention is not restricted thereto and may also be applied to transmission of digital signals of data, etc.

As explained above, since first serial digital signals at a first transmission speed may be transmitted along the transmission path for second serial digital signals at a second transmission speed according to the present invention, the first serial digital signals may be transmitted without the necessity of changing the interior (timing extract circuit, multiplicity, etc.) of the time division multiplex transmission system for the multi-channel second serial digital signals.

Also, since the present is designed so that by making use of the characteristics of a variety of digital signals such as composite serial digital signals, component serial digital signals, composite parallel digital signals and component parallel digital signals, component serial digital signals are divided into two through the transmitter to output pseudo, second serial digital signals at a second transmission speed through two output terminals, and to transmit a single series of component serial digital signals using two channels of the composite serial digital signal transmission system of the time division multiplexer, the component signals and the composite signals have no apparent points of difference, and thus time division multiple signals composed of a mixture of composite serial digital signals and component serial digital signals at different transmission speeds may be transmitted regardless of the restriction that "all the signals to be transmitted must be synchronized in their frequencies".

What is claimed is:

1. A method of transmitting digital signals, comprising:
    a first series of serial digital signals at a first transmission speed are converted into a first series of parallel digital signals having a first frequency, and then dummy data is added to said first series of parallel digital signals to produce a second series of parallel digital signals having a second frequency by using second clocks which are produced by conversion of the frequency of first clocks in said first series of parallel digital signals into a prescribed frequency;

said second series of parallel digital signals are converted into a second series of serial digital signals which are then divided in bits alternately between two output terminals based on switching signals of a prescribed frequency obtained by multiplying the frequency of said second clocks, to output a pseudo second series of serial digital signals at a second transmission speed via said two output terminals, respectively;

at least two of said pseudo second series of serial digital signals are transmitted through a time division multiplexer where the two are processed as two-channel serial digital signals by time division multiplexing, via a transmission path to a time division demultiplexer through which said two of said pseudo second series of serial digital signals are taken in parallel;

third clocks which are extracted from said two of said pseudo second series of serial digital signals taken in parallel from said time division demultiplexer, are multiplexed to a prescribed frequency to generate fourth clocks which are used to convert said two of said pseudo second series of serial digital signals into a single series of serial digital signal which are then converted into said second series of parallel digital signals;

said dummy data is deleted from said second series of parallel digital signals based on signals generated by dividing the frequency of said fourth clocks into prescribed frequencies to restore said first series of parallel digital signals; and said first series parallel digital signals are encoded to restore said first serial digital signals.

2. A method of transmitting digital signals are claimed in claim 1, wherein said time division multiplexer has a plurality of at least three channels with input terminals for combining together said second serial digital signals at the second transmission speed, said two of said pseudo second series of serial digital signals and said second series of serial digital signals by time division multiplexing into a single series of signals.

3. A method of transmitting digital signals as claimed in claim 1, wherein said first series of serial digital signals are component serial digital signals obtained by serially synthesizing digital luminance signals and two types of digital chrominance signals in bits which have been obtained separately by sampling luminance signals and two types of chrominance signals at a prescribed frequency, and encoding them;

said first series of parallel digital signals are component parallel digital signals produced by successively synthesizing said digital luminance signals and the two types of digital chrominance signals in parallel by quantization in a prescribed number of bits;

said second series of parallel digital signals are composite parallel digital signals produced by sampling at a prescribed frequency and encoding of multiple signals composed of luminance signals and carrier chrominance signal multiplexed to share a band with the high-frequency region of the luminance signals; and said second serial digital signals are composite serial digital signals produced by bit-by-bit serial synthesis of said composite parallel digital signals.

4. A transmitter for the method of transmitting digital signals as claimed in claim 1, comprising:

a decoder for converting first serial digital signals at a first transmission speed into first parallel digital signals having a first frequency;

a first multiply circuit for converting first clocks in said first series of parallel digital signals which have been taken through said decoder, into second clocks of a prescribed frequency;

a dummy data add circuit for adding dummy data to said first series of parallel digital signals from said decoder, based on said first and second clocks to produce redundant parallel digital signals of a second sampling frequency;

an encoder for converting said second series of parallel digital signals from said dummy data add circuit, into serial signals;

a second multiply circuit for multiplying the frequency of said second clocks to a prescribed frequency; and a switching circuit for receiving the clocks outputted through said second multiply circuit as switching signals, and dividing the serial signals from said encoder in bits alternately between two output terminals to output them as pseudo, second serial digital signals at a second transmission speed through said two output terminals, respectively.

at least two of said pseudo second series of serial digital signals being supplied to a time division multiplexer to be processed by time division multiplexing into two-channel serial digital signals.

5. A transmitter as claimed in claim 4, wherein said first series of serial digital signals are component serial digital signals obtained by serially synthesizing digital luminance signals and two types of digital chrominance signals in bits which have been obtained separately by sampling luminance signals and two types of chrominance signals at a prescribed frequency, and encoding them;

said first parallel digital signals are component parallel digital signals produced by successively synthesizing said digital luminance signals and the two types of digital chrominance signals in parallel by quantization in a prescribed number of bits;

said second series of parallel digital signals are composite parallel digital signals produced by sampling at a prescribed frequency and encoding of multiple signals composed of luminance signals and carrier chrominance signal multiplexed to share a band with the high-frequency region of the luminance signals; and said second series of serial digital signals are composite serial digital signals produced by bit-by-bit serial synthesis of said composite parallel digital signals.

6. A receiver for the method of transmitting digital signals as claimed in claim 1, comprising:

clock generating means for extracting third clocks from said two of said pseudo second series of serial digital signals which have been taken in parallel through said time division demultiplexer to multiply their frequency to a prescribed frequency to produce fourth clocks;

a switching circuit for receiving said fourth clocks as switching signals to synthesize said two of said pseudo second series of serial digital signals from said time division demultiplexer, in bits alternately to output redundant serial digital signals;

a decoder for decoding said redundant serial digital signals for conversion into said redundant parallel digital signals;

a frequency demultiply circuit for demultiplying said fourth clocks to produce timing signals of a prescribed frequency;

a dummy data delete circuit for deleting said dummy data from said redundant parallel digital signals based on the timing signals outputted from said frequency demultiply circuit, to restore said first parallel digital signals; and an encoder for encoding said first parallel digital signals taken through said dummy data delete circuit to restore said first series of serial digital signals.

7. A receiver as claimed in claim 6, wherein said first series of serial digital signals are component serial digital signals obtained by serially synthesizing digital luminance signals and two types of digital chrominance signals in bits which have been obtained separately by sampling luminance signals and two types of chrominance signals at a prescribed frequency, and encoding them;

said first series of parallel digital signals are component parallel digital signals produced by successively synthesizing said digital luminance signals and the two types of digital chrominance signals in parallel by quantization in a prescribed number of bits;

said second series of parallel digital signals are composite parallel digital signals produced by sampling at a prescribed frequency and encoding of multiple signals composed of luminance signals and carrier chrominance signal multiplexed to share a band with the high-frequency region of the luminance signals; and said second series of serial digital signals are composite serial digital signals produced by bit-by-bit serial synthesis of said composite parallel digital signals.

\* \* \* \* \*